(12) United States Patent
Ohsato

(10) Patent No.: US 7,262,926 B2
(45) Date of Patent: Aug. 28, 2007

(54) LENS BARREL

(75) Inventor: Masayoshi Ohsato, Hachioji (JP)

(73) Assignee: Konic Minolta Opto, Inc., Tokyo (JP)

( * ) Notice: Subject to any disclaimer, the term of this patent is extended or adjusted under 35 U.S.C. 154(b) by 0 days.

(21) Appl. No.: 11/435,481

(22) Filed: May 17, 2006

(65) Prior Publication Data

US 2006/0262430 A1    Nov. 23, 2006

(30) Foreign Application Priority Data

May 23, 2005    (JP)    ............... 2005-149368

(51) Int. Cl.
    *G02B 7/02*    (2006.01)
(52) U.S. Cl. .................. 359/814; 359/822; 359/824
(58) Field of Classification Search ................ 359/694,
    359/703, 811, 813–814, 819, 821–822, 824,
    359/827
    See application file for complete search history.

(56) References Cited

U.S. PATENT DOCUMENTS

| | | | | |
|---|---|---|---|---|
| 4,963,000 A | * | 10/1990 | Kawai | ............... 359/824 |
| 5,430,375 A | * | 7/1995 | Inoue et al. | ........... 324/207.21 |
| 5,638,222 A | * | 6/1997 | Shigehara | ................ 359/814 |
| 5,675,444 A | * | 10/1997 | Ueyama et al. | ........... 359/824 |
| 5,859,733 A | * | 1/1999 | Miyano et al. | ............. 359/824 |
| 5,939,804 A | * | 8/1999 | Nakao et al. | ................. 310/12 |
| 5,973,439 A | * | 10/1999 | Nishio et al. | .......... 310/323.12 |
| 6,078,438 A | * | 6/2000 | Shibata et al. | .............. 359/819 |
| 6,268,970 B1 | * | 7/2001 | Ito et al. | ................... 359/826 |
| 2004/0178699 A1 | * | 9/2004 | Nakanishi | ............. 310/323.01 |
| 2005/0007683 A1 | * | 1/2005 | Ryu et al. | .................. 359/824 |
| 2005/0195502 A1 | * | 9/2005 | Jeong et al. | ................ 359/808 |
| 2005/0219719 A1 | * | 10/2005 | Kawai | ....................... 359/819 |

* cited by examiner

*Primary Examiner*—Scott J. Sugarman
*Assistant Examiner*—DaWayne A. Pinkney
(74) *Attorney, Agent, or Firm*—Cohen Pontani Lieberman & Pavane LLP (57) ABSTRACT

There is described a lens barrel including; a plurality of lens units; an actuator to move at least a lens unit included in the plurality of lens units; and a housing member. The actuator includes: a vibrating device constituted by two vibrating members, each of which includes piezoelectric elements aligned in a line, so that the two vibrating members intersect each other at a predetermined angle and vibrate in response to high-frequency electric signals; a driven member, coupled to the lens unit, to be moved by vibrations generated by the vibrating device; and a supporting member that is rotatably mounted on a shaft disposed opposite to the vibrating device in such a manner that the vibrating device press-contacts the driven member. The driven member is disposed at a side of the lens unit, while the vibrating device and the supporting member are disposed at a side of the housing member.

4 Claims, 6 Drawing Sheets

LENS BARREL

This application is based on Japanese Patent Application No. 2005-149368 filed on May 23, 2005, with the Japanese Patent Office, the entire content of which is hereby incorporated by reference.

TECHNICAL FIELD

The present invention relates to a lens barrel for an image pickup device, in which magnification lens units and focusing lens units in the lens barrel are shifted by vibration generated by a vibration unit.

BACKGROUND

A driving device is well known in which the alternating current voltage is applied to a piezoelectric element so that a vibrating section is oscillated, and the vibrating section is repeatedly brought into contact with or separated from members to be shifted, whereby the members can be shifted by friction force. A lens barrel is also well known in which above driving device is used for shifting the lens units.

As a driving device, which uses the piezoelectric element to shift lens units along the optical axis, a lens driving device is disclosed in which a vibrator to create driving vibration along the optical axis is pressed by an elastic member against a guide shaft, which is a stationary part prolonging along the optical axis, and the vibrator is assembled in a lens supporting member (see Patent Document 1).

[Patent Document 1] Unexamined Japanese Patent Application Publication 8-179184

However, the lens driving device of Patent Document 1 features the vibrator in the lens supporting member, and the vibrator is pressed against a guide shaft, which guides the lens supporting member along the optical axis, via the elastic member. Accordingly, due to the reaction force of pressing force caused by the elastic member, the guide shaft is off-center in the hole of the lens supporting member. Consequently, friction increases between the hole of the lens supporting member and the engaging guide shaft, and off-center abrasion is created in the hole of the lens supporting member, which results in unstable movement, and further, the position of the lens units is shifted in the direction perpendicular to the optical axis by the off-center abrasion of the hole, resulting in deterioration of the desired lens characteristics.

Further, since the movement of the lens units by the vibrator is conducted due to the friction force, the friction force between the hole of the lens supporting member and the engaging guide shaft works in the direction to reduce the driving force of the vibrator, which results in the reduction of the driving efficiency of the vibrator, and further the change of the friction force between the hole and the guide shaft triggers unstable movement.

This problem happens by the reaction force of the elastic member, even when the stationary part is separated from the guide shaft, as a separated structure.

SUMMARY OF THE INVENTION

To overcome the abovementioned drawbacks in conventional lens barrels, it is an object of the present invention to provide a lens barrel using a vibration actuator having high driving efficiency, stable operation, and high durability.

Accordingly, to overcome the cited shortcomings, the abovementioned object of the present invention can be attained by lens barrels described as follow.

(1) A lens barrel, comprising: a plurality of lens units to focus light coming from a subject onto an imaging element; an actuator to move at least a lens unit included in the plurality of lens units; and a housing member to support the plurality of lens units and the actuator; wherein the actuator includes: a vibrating device constituted by two vibrating members, each of which includes a plurality of piezoelectric elements aligned in a line, so that the two vibrating members intersect each other at a predetermined angle and vibrate in response to high-frequency electric signals; a driven member, coupled to the lens unit, to be moved by vibrations generated by the vibrating device; and a supporting member that is rotatably mounted on a shaft disposed opposite to the vibrating device in such a manner that the vibrating device press-contacts the driven member while putting the driven member between the vibrating device and the supporting member; and wherein the driven member is disposed at a side of the lens unit, while the vibrating device and the supporting member are disposed at a side of the housing member.

(2) The lens barrel of item 1, further comprising: a position detecting sensor to detect a current position of the lens unit, the position detecting sensor including a sensor scale and a sensing section; wherein the sensing section is disposed at a side of the lens unit, while the sensor scale is disposed at a side of the housing member.

(3) The lens barrel of item 2, wherein the plurality of lens units constitute a zooming optical system in which plural moving lens units are moved for zooming and focusing; and wherein the sensor scale, included in the position detecting sensor, is commonly employed for detecting current positions of the plural moving lens units.

(4) The lens barrel of item 1, wherein the actuator is disposed inside the housing member.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which.

DESCRIPTION OF THE PREFERRED EMBODIMENTS

This invention is explained referring to the embodiments below, however it is not limited to these embodiments.

Firstly, the vibration actuator used in the lens barrel of the embodiment will be detailed.

Figure 1:
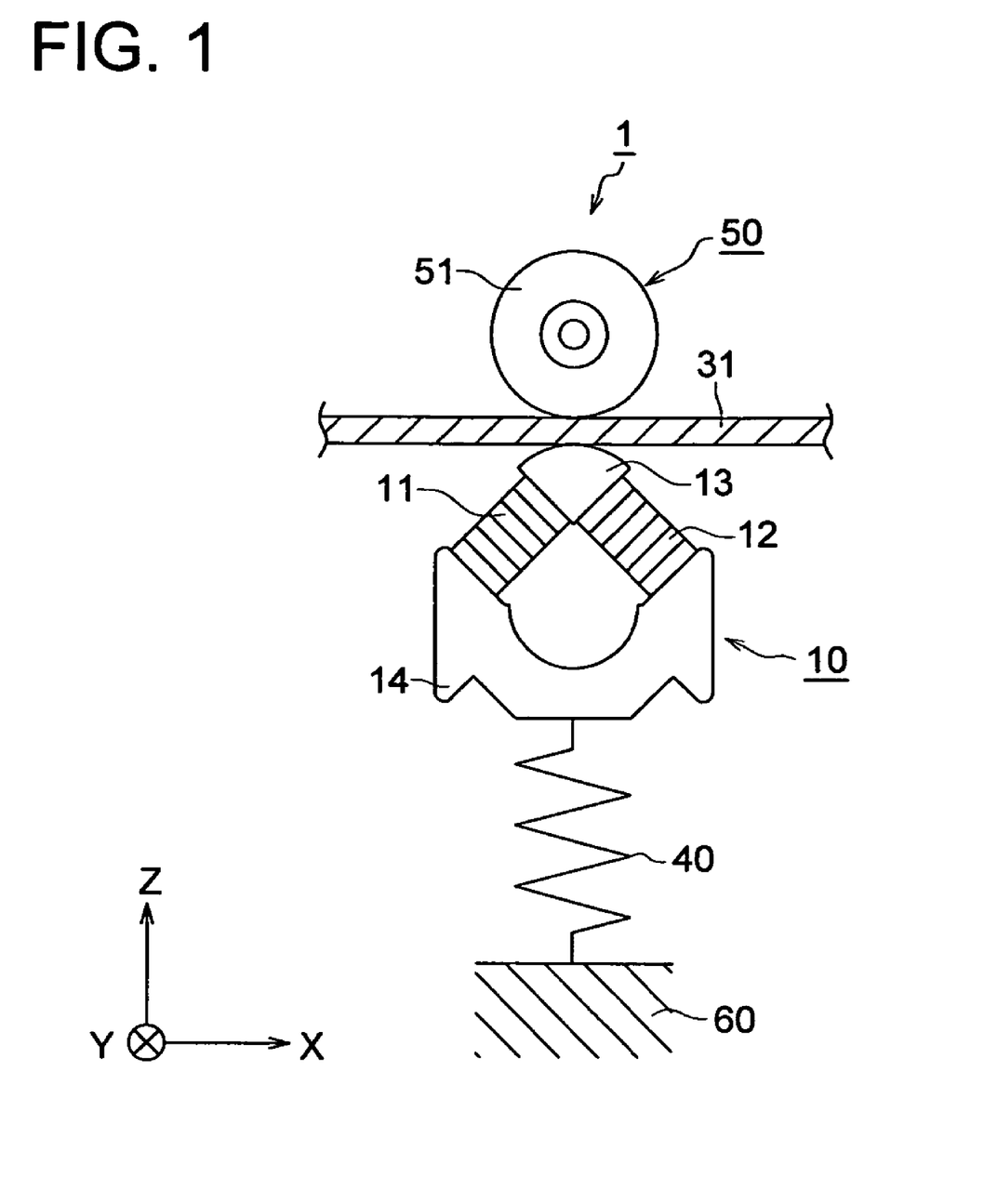
FIG. 1 is a front elevation view of the vibration actuator used in the lens barrel relating to the present embodiment.
Figure 2:
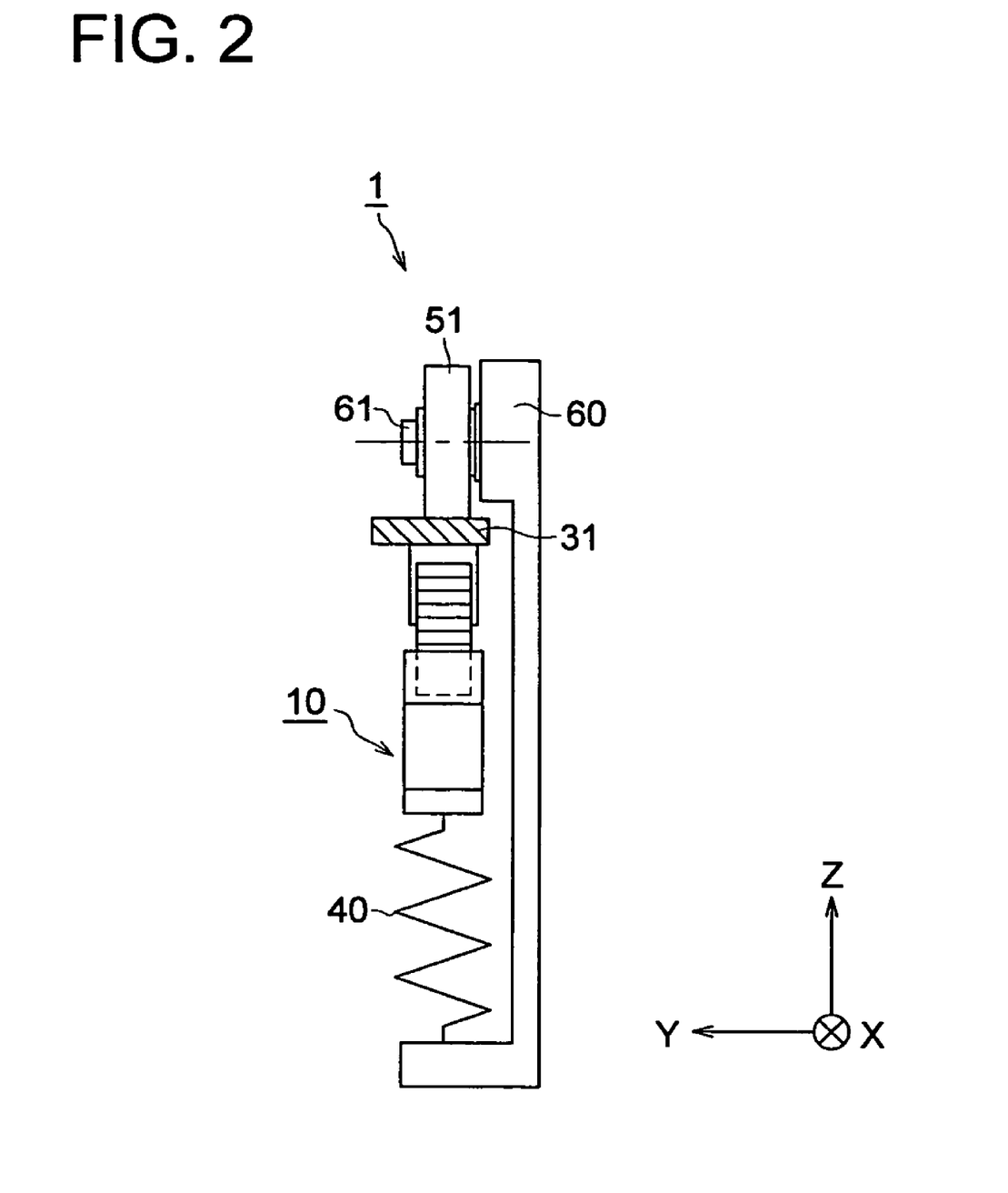
FIG. 2 is a side view of the vibration actuator used in the lens barrel relating to the present embodiment.

FIGS. 1 and 2 show vibration actuator 1 (being a driving device) used in the lens barrel relating to the present embodiments. FIG. 1 shows a front view of vibration actuator 1 used in the lens barrel relating to the embodiment. FIG. 2 shows a side view of vibration actuator 1 used in the lens barrel relating to the present embodiments. Additionally, the direction is shown by common orthogonal XYZ coordinates in each figure.

In FIGS. 1 and 2, vibration actuator 1 contains vibrating member 10, being a driving source, driven member 31 which is driven by vibrating member 10 and serves as a driven member, pressure applying member 40 formed of an elastic member, supporting member 50 (being a load supporting member) to support the force (being a load) which is given to driven member 31 from vibrating member 10, and base plate 60.

Vibrating member 10, driven member 31 and supporting member 50 are arranged in that order in direction Z in FIG. 1.

Vibrating member 10 is structured of piezoelectric elements 11 and 12, chip member 13 and base 14, and vibrates based on applied high frequency voltage (high frequency signal).

Piezoelectric elements 11 and 12 are arranged so as to cross each other as shown in FIG. 1, and the crossed end is joined to chip member 13. The other ends of piezoelectric elements 11 and 12 are joined to base 14. Chip member 13 preferably has a stable and high friction coefficient, as well as being preferably structured of the non-abrasive materials (for example, a hard metal). Base 14 is preferably structured of an hard material which is easily produced (for example, stainless-steel). Piezoelectric elements 11 and 12 are adhered to chip member 13 and base 14 by an adhesive agent, preferably being an epoxy adhesive having high adhesive strength.

Piezoelectric elements 11 and 12 are a type of laminated elements, structured of thin plural ceramic plates and electrodes, both of which are alternately layered. Piezoelectric elements 11 and 12 are displacement elements, which expand and contract perpendicular to the laminated surfaces based on the applied voltage. Specifically, they expand based on the applied predetermined polar voltage, and contract based on the applied opposite polar voltage. Due to this, based on the frequency of applied alternating current voltage, piezoelectric elements 11 and 12 repeatedly expand and contract. Accordingly, when the alternating current voltage including phase-contrast is applied onto piezoelectric elements 11 and 12, it is possible to vibrate vibrating member 10.

Figure 3A:
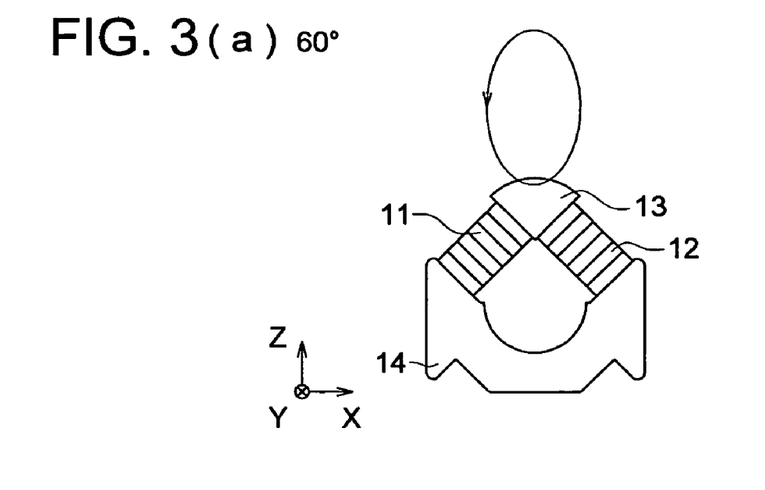
FIG. 3(a), FIG. 3(b) and FIG. 3(c) show the driving operations of the vibrating section.
Figure 3B:
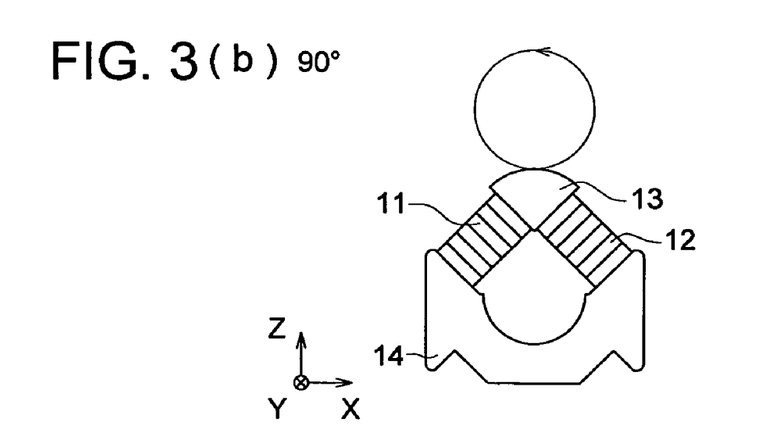
Figure 3C:
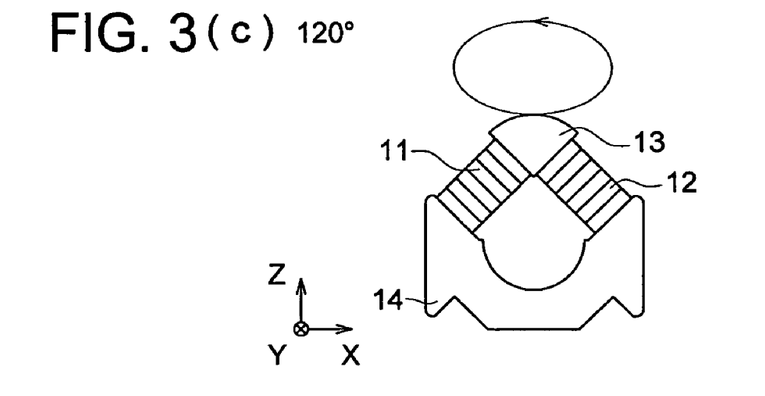

FIG. 3(*a*), FIG. 3(*b*) and FIG. 3(*c*) show the driving operations of vibrating member 10. Piezoelectric elements 11 and 12 of vibrating member 10 are activated by the alternating current voltage having the phase contrast, and thereby, chip member 13 of vibrating member 10 can be elliptically driven.

FIG. 3(*a*) shows the movement track of chip member 13 in a phase contrast at an angle of 60°, FIG. 3(*b*) shows that at 90°, and FIG. 3(*c*) shows that at 120°. As shown in FIG. 3(*b*), when the phase contrast is set to 90°, chip member 13 circulates. By changing the phase contrast, it is possible to set a desired movement track for chip member 13.

Vibrating member 10 allows driven member 31 to move by using the movement track of chip member 13.

Referring to FIGS. 1 and 2, driven member 31 comes into contact with chip member 13 of vibrating member 10, and the driving force from vibrating member 10 is directly transported to driven member 31. Specifically, due to the vibration of vibrating member 10, driven member 31 repeatedly touches (hits) and separates from chip member 13, and is driven by the friction force between chip member 13 and driven member 31. In other words, by repeating short contact movement by the friction force between chip member 13 of vibrating member 10 and the surface of driven member 31, base plate 60 which supports vibrating member 10 and supporting member 50, or driven member 31 can be driven.

Driven member 31 is formed of metallic member or a ceramic. In order to prevent abrasion caused by contact with chip member 13, the metallic surface of driven member 31 is preferably coated with a hard covering. For example, for iron group material such as stainless steel, it is preferably treated with a thermal hardening process or nitriding process, and for aluminum, anodized aluminum film is preferable, or its metallic surface is preferably coated with ceramic as a durable abrasion coating. Further, by covering with alumina ceramic or zirconia ceramic, it is possible to attain weight saving, high rigidity, as well as minimal abrasion.

Pressure applying member 40 is assembled between vibrating member 10 and base plate 60, that is, pressure applying member 40 is under vibrating member 10 (in direction −Z). Pressure applying member 40 is structured of an elastic member, such as coiled spring, one end of which is fixed on base member 14 of vibrating member 10, while the other end is fixed on base plate 60. By urging force generated by pressure applying member 40, chip member 13 of vibrating member 10 is lightly pressed against driven member 31. In addition, the urging force of pressure applying member 40 is relatively small, and the expanding and contracting movement of pressure applying member 40 is adjusted so as not to follow the very high vibrating frequency of vibrating member 10. Due to this, chip member 13 repeatedly touches and separates from driven member 31, in opposition to the urging force of pressure applying member 40.

Further, supporting member 50 is arranged in such a manner that driven member 31 is sandwiched between supporting member 50 and chip member 13, that is, supporting member 50 is arranged on driven member 31 (in direction +Z). As shown in FIG. 1, supporting member 50 is structured of rotatable roller 51, secured by shaft 61. In addition, since roller 51 is secured by securing members which are not illustrated, roller 51 is prevented from slipping from shaft 61.

Roller 51 of supporting member 50 is arranged at the position immediately above chip member 13 of vibrating member 10, while driven member 31 is sandwiched between roller 51 and chip member 13. By such a structure, the force in direction Z, generated by vibrating means 10, is definitely supported so that a large driving force can be transferred to driven member 31.

Roller 51 is preferably formed of a material whose friction against driven member 31 is small. Specifically, among resin materials (for example, POM (polyacetal)), material having high sliding characteristics is preferable. For example, to improve the sliding characteristics, it is preferable to use the material to which an additive such as fluorine is compounded. In addition, the material which would not deformed by load is preferable for use. Besides, roller 51 can be formed of a metallic material.

The above descriptions are the outline of the vibration actuator to be used for the lens barrel of the present embodiments.

Figure 4:
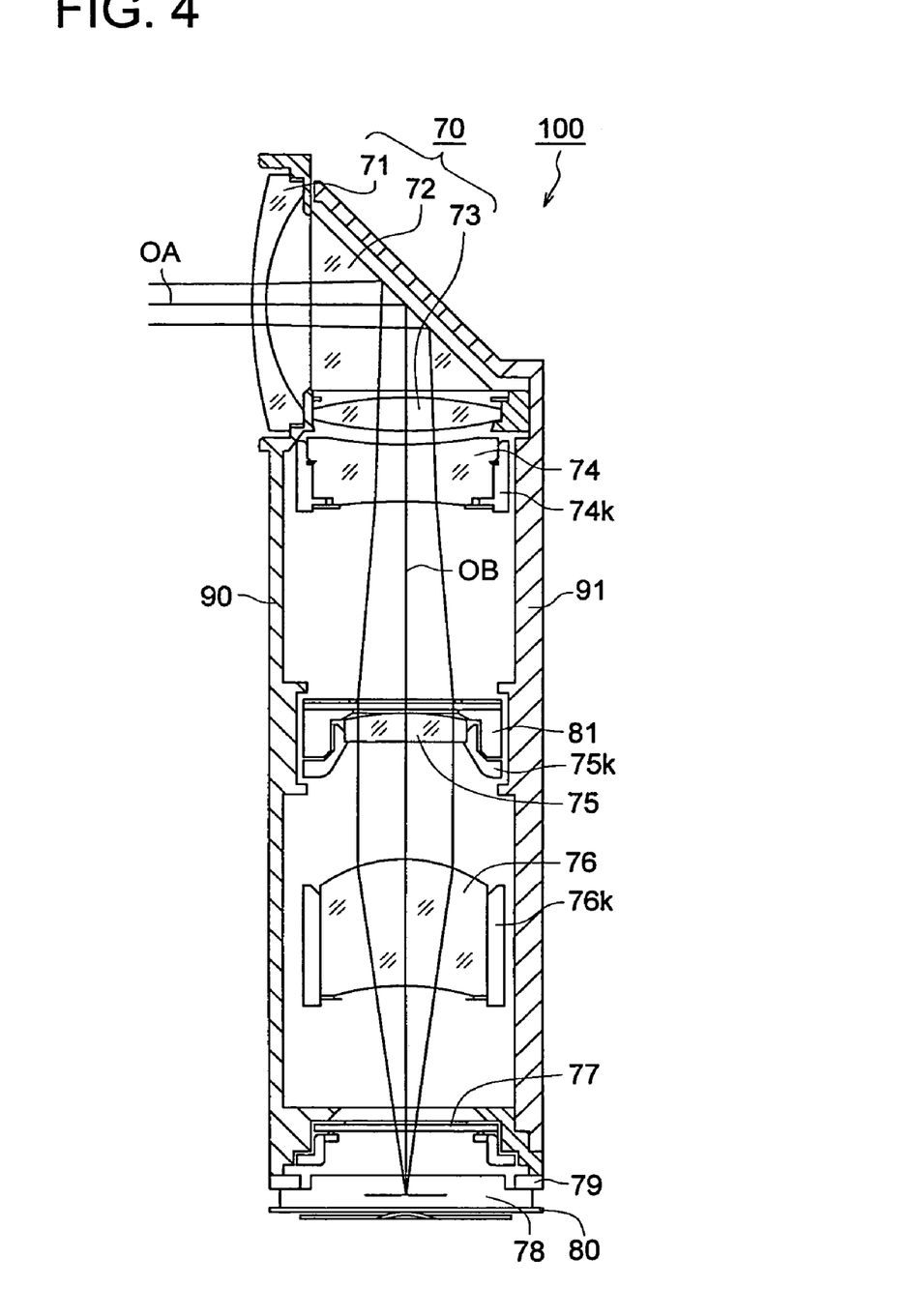
FIG. 4 is a cross-section of an example of the lens barrels relating to the present embodiment.

FIG. 4 is a sectional view showing an example of lens barrel 100 relating to the present embodiment. The lens units shown in FIG. 4 is a zoom lens structured in a bending optical system, showing the wide angle, and the lens barrel is sectioned by a surface including an optical axis before reflection and another optical axis after reflection. Additionally, in the present embodiment, the vibration actuator is used for moving the lens units structured in the above reflective optical system, however, the example is not limited to this, that is, the vibration actuator can also be used for moving the lens units structured in an optical system having a straight line optical axis.

Line OA is an optical axis before bending, while line OB is that after bending. Lens barrel 100 is covered with "main barrel A" 90 and "main barrel B" 91 as housing units.

First lens unit 70 is structured of lens 71 having optical axis OA and facing the subject, prism 72 to bend optical axis OA at nearly a right angle, and lens 73 arranged to have optical axis OB which corresponds to optical axis OA bent by prism 72. First lens unit 70 is secured onto "main barrel A" 90.

Second lens unit 74 is assembled in second lens unit frame 74k, and is integrally movable with second lens unit frame 74k to change magnification (hereinafter referred to as "zooming").

Third lens unit 75 is assembled in third lens unit frame 75k, and since third lens unit frame 75k is fixed onto "main barrel A" 90, third lens unit 75 does not move while zooming.

Fourth lens unit 76 is assembled in fourth lens unit frame 76k, being integrally movable with fourth lens unit frame 76k for focal adjustment (hereinafter referred to as "focusing") and zooming.

Optical filter 77, which is formed of an infra-red ray cut filter and an optical low pass filter, is assembled within "main barrel A" 90. Numeral 78 represents an image pickup element, and for which a CCD (charge coupled device) type image sensor, or a CMOS (complementary metal-oxide semiconductor) type image sensor is used. Image pickup element 78 is assembled on mount 79, and mount 79 and image pickup element 78 are assembled within "main barrel A" 90. Flexible printed circuit board 80, connected to image pickup element 78, is also connected to all other circuit boards of the camera. Shutter unit 81 is fixed onto "main barrel A" 90, in the same way as third lens unit frame 75k.

Second lens unit 74 and fourth lens unit 76 are moved from the wide angle position shown in FIG. 4 toward third lens unit 75 by set amounts to perform the zooming operation. Fourth lens unit 76 is further adjusted from the zoomed position to perform the focusing operation.

Figure 5:
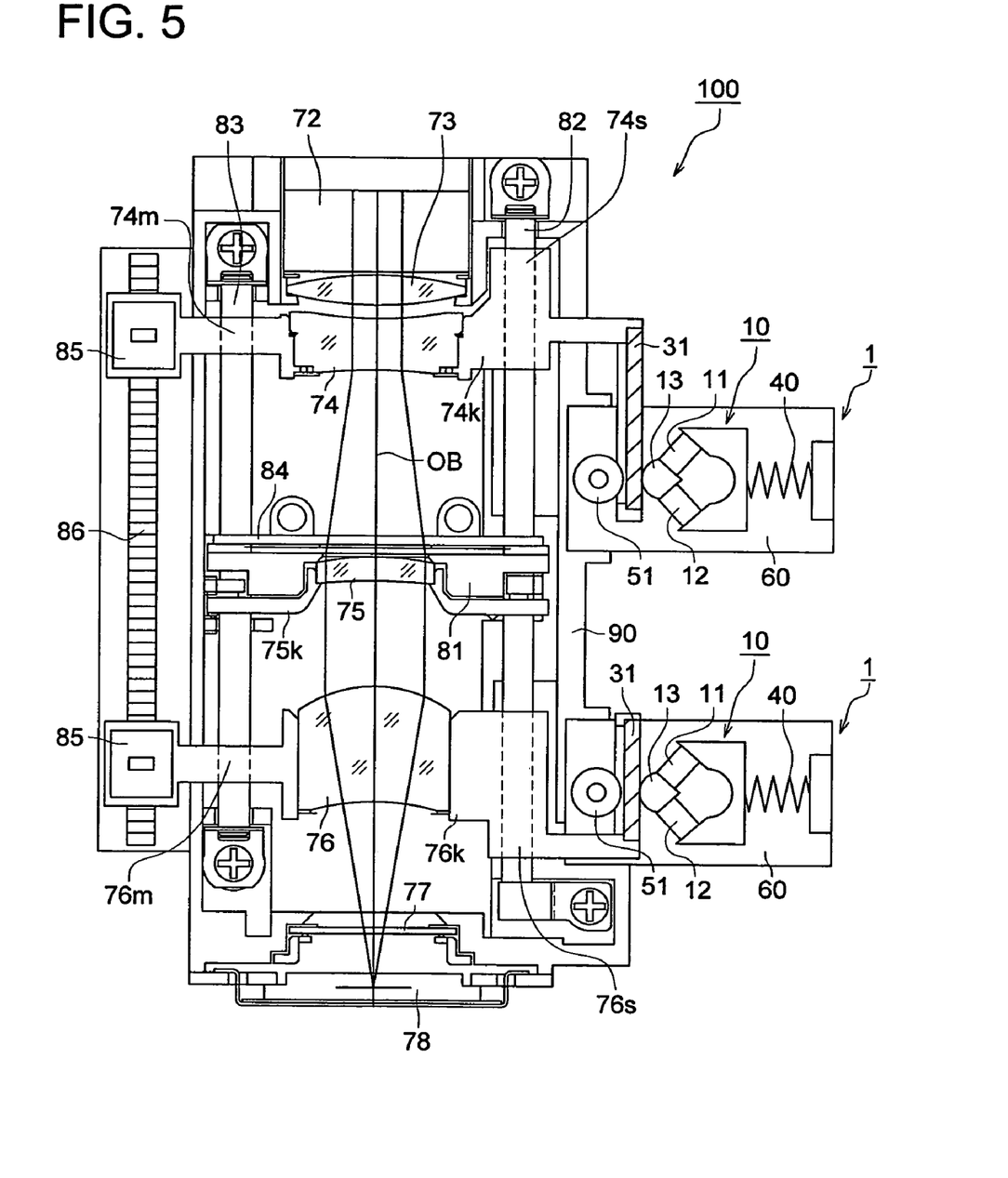
FIG. 5 is a cross-section of the driving mechanisms of the second lens unit and the fourth lens unit.

FIG. 5 illustratively shows a moving mechanism of second lens unit 74 and fourth lens unit 76. This figure shows the condition in which second lens unit 74 and fourth lens unit 76 are at the wide angle position. In the following figures, the same numbers are given to the members having the same functions to avoid the repetition of the explanation. In addition, to more easily understand the structure, FIG. 5 is illustrated in such a way that the position of the vibration actuator 1 is shifted to the outside of the lens barrel.

In FIG. 5, guide shaft 82 penetrates sleeve 74s integrally formed on second lens unit frame 74k, and also penetrates sleeve 76s integrally formed on fourth lens unit frame 76k. Further, guide shaft 83 penetrates anti-rotation device 74m integrally formed in second lens unit frame 74k and, also penetrates anti-rotation device 76m integrally formed in fourth lens unit frame 76k. By this structure, it is possible to guide second lens unit frame 74k and fourth lens unit frame 76k by guide shafts 82 and 83, and to move second lens unit frame 74k and fourth lens unit frame 76k in the direction of optical axis OB.

Further, guide shafts 82 and 83 engage and penetrate shutter unit 81 and third lens unit frame 75k. Each end of guide shafts 82 and 83 is fixed, and at the centers of guide shafts 82 and 83, guide shaft supporting member 84 is provided.

Yet further, driven member 31, structured in vibration actuators 1 is integrally assembled with second lens unit frame 74k, or fourth lens unit frame 76k Driven member 31 mounted to second lens unit frame 74k is disposed in such a manner that driven member 31 is sandwiched between vibrating member 10 of vibration actuators 1 and roller 51 serving as a supporting member. Base plate 60 supporting vibrating member 10 and roller 51 is fixed onto "main barrel A" 90. Another driven member 31 mounted to fourth lens unit frame 76k is also disposed in the same manner as the above.

Yet further, piezoelectric elements 11 and 12 are electrically connected to the flexible printed circuit board, which are not illustrated in FIG. 5, so as to respectively receive alternate current voltage.

By the above described structure, piezoelectric elements 11 and 12 are activated by the alternate current voltage having phase difference, and chip members 13 of vibrating members 10 are allowed to move in an ellipsoid path. Second lens unit frame 74k and fourth lens unit frame 76k, onto each of which driven member 31 is mounted, can be moved in the direction of optical axis OB while being guided by guide shafts 82 and 83.

Yet further, to detect the position of second lens unit frame 74k and fourth lens unit frame 76k, thin magnetic film resistor elements 85, which serve as a position sensor, are integrally provided on each of lens unit frames 74k and 76k. At the position corresponding to the position of thin magnetic film resistor elements 85, sensor scale 86 featuring multiple magnetic poles N and S one after the other in the moving direction is fixed onto "main barrel A" 90. Though it is not illustrated, thin magnetic film resistor elements 85 are electrically connected to the flexible printed circuit board, whereby the outputted signals, produced by the shifted position of thin magnetic film resistor elements 85, are electrically detected, and the positions of first and second lens unit frame 74k and fourth lens unit frame 76k can be determined.

Since sensor scale 86 is assembled so as to be commonly used for second lens unit frame 74k and fourth lens unit frame 76k as shown in FIG. 5, assembly time is reduced resulting in reduced production cost. Yet further, since the same position on sensor scale 86 can be used for detecting the positions of each different lens unit, in the case that plural lens units move in the same direction, the detecting sensors arranged for each lens unit can be placed closer than the interval between each lens unit, and thereby, the length of sensor scale 86 can be shortened.

Figure 6:
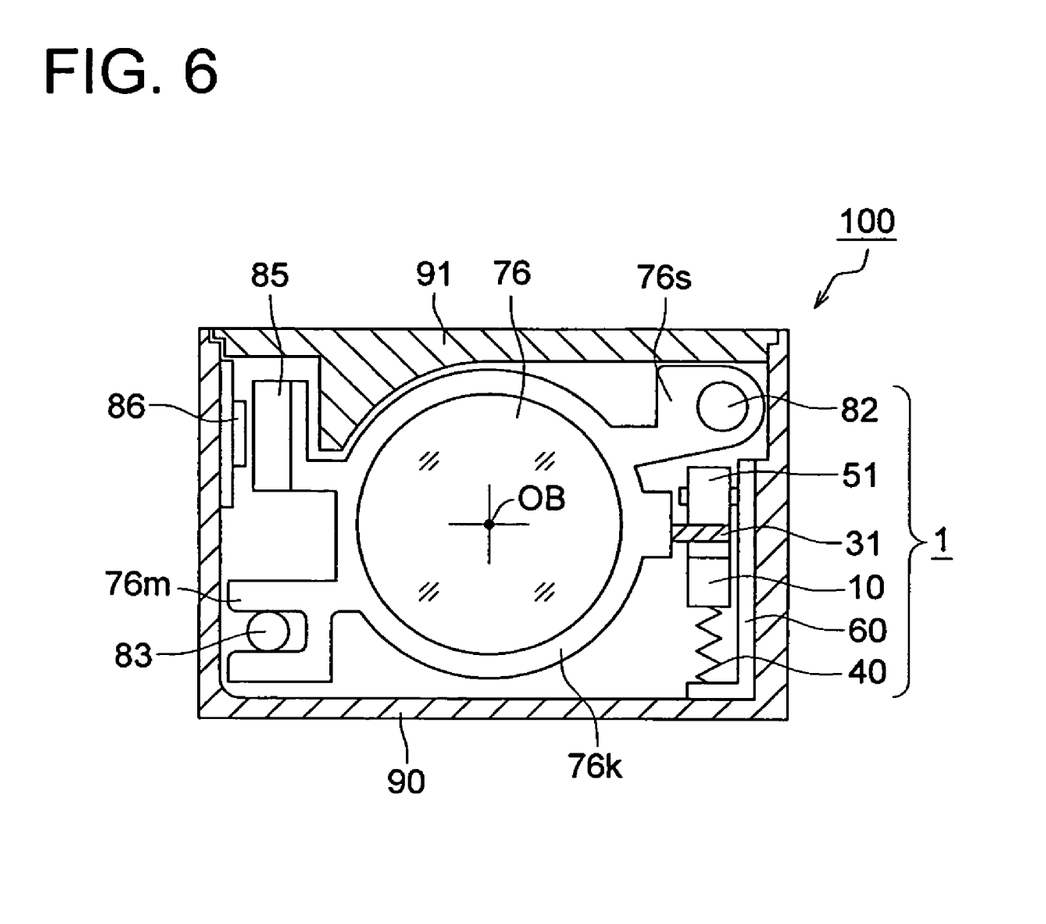
FIG. 6 is a cross-section of the lens barrel cut by a surface passing through the fourth lens unit, and perpendicular to the optical axis.

By the above structure, vibration actuator 1 corresponding to second lens unit frame 74k and vibration actuator 1 corresponding to fourth lens unit frame 76k can be activated independently, and both second lens unit frame 74k and fourth lens unit frame 76k can be shifted to the targeted position for zooming. Then, only fourth lens unit frame 76k is further shifted for focusing. FIG. 6 is a cross-section of the lens barrel taken along a surface passing through fourth lens unit 76, and perpendicular to optical axis OB.

The cross-section of lens barrel 100 taken along the surface perpendicular to optical axis OB is approximately rectangular, and guide shaft 82 arranged in an opposing corner of the rectangle penetrates sleeve 76s, while guide shaft 83 penetrates anti-rotation device 76m.

In one of the other opposing corners of the rectangle, arranged are thin magnetic film resistor element 85 which serves as a position sensor and is integrally assembled in fourth lens unit frame 76k, and further, sensor scale 86 which is fixed on "main barrel A" 90 corresponding to thin magnetic film resistor elements 85 and has multiple magnetic poles N and S one after the other in parallel to optical axis OB.

Further, in the other opposing corner, vibration actuator 1 is provided. Driven member 31 structured as one member of vibration actuator 1 is integrally assembled with fourth lens unit frame 76k. Roller 51, serving as a supporting member, vibrating member 10 and pressure applying member 40 are fixed on "main barrel A" 90 by base plate 60.

In addition, since second lens unit frame 74k, which supports second lens unit 74, has the same structure, the explanation is not repeated.

As explained above, vibration actuator 1, which is positioned flatways, can be arranged in various orientations, compared to the case of a columnar stepping motor being employed, and thereby the cross section area of lens barrel 100 can be reduced. Yet further, since vibration actuator 1 can be arranged in a space surrounded by "main barrel A" 90 and "main barrel B" 91, both being the housing sections, dust is prevented from entering lens barrel 100. Yet further, undesired noise is greatly reduced so that lens barrel 100 can be preferably used for the camera which records sound while taking moving pictures.

Since the actuator for moving the lens units is constituted by vibrating member 10 which is arranged so as to allow the plural piezoelectric elements to cross each other at a predetermined angle, driven member 31 moved by the vibration of vibrating member 10 and roller 51, being a rotatable supporting member, which is arranged facing vibrating member 10, which sandwiches driven member 31 with roller 51, and further, since driven member 31 is fixed onto the lens frame for holding the lends units, and vibrating member 10 and roller 51 are positioned at the main barrel side, it is possible for roller 51 to receive the reaction force of the pressure onto driven member 31 generated by vibrating member 10, and the reaction force exerted perpendicular in the moving direction, can be prevented from pushing the lens frames and the guide shafts. Due to this, the change of the undesired friction force between the lens frames and the guide shafts is overcome, and the lens barrel is stably driven at high efficiency, whereby high durability can be obtained.

Yet further, while vibration actuator 1 of the present embodiment is not activated, driven member 31 is sandwiched between vibrating member 10 and roller 51, whereby the positions of the lens frames are secured during no electrical flow, that is, it is possible to secure the lens units with no electrical flow, which reduces electrical energy.

Still further, the lens frame also functions as a vibration damper for suppressing the vibrating actions of the driven member 31.

Concerning the initial positions as the basing points of second lens unit frame 74k and fourth lens unit frame 76k, stop points can be employed at which the position detecting sensors do not show any change while the vibration actuators are activated to move the lens units in the predetermined directions. As another method, masking plates can be employed, which are formed on second lens unit frame 74k and fourth lens unit frame 76k, and the initial positions as the basing points are determined by the masking plates and the photo-interrupters. It is also possible for photo-reflectors and the photo-interrupters to be used for the detection of the initial positions.

Yet further, concerning the detection of the moved distance of second lens unit frame 74k and fourth lens unit frame 76k, it is not necessary to limit the thin magnetic film resistor elements and the scale sensor to be formed of magnetic material. For example, it is possible to employ scale sensors, being the photo-interrupters, which are assembled onto second lens unit frame 74k and fourth lens unit frame 76k, and the scale sensors in which light passing sections and light shielded sections are formed one after the other. Yet further, it is also possible to employ scale sensors, being the photo-reflectors, which are assembled onto second lens unit frame 74k and fourth lens unit frame 76k, and the scale sensors formed of light reflecting sections and non-reflect sections alternatively. In each case, it is possible to employ a single common sensor scale for second lens unit frame 74k and fourth lens unit frame 76k.

In addition, in the above embodiments, the two lens units structured in the zooming optical system are driven for zooming and focusing. However, it is possible to use the embodiment of the optical system with the other structures, and further, the present embodiments can also be used for the focusing operation of a single focal optical system, which do not depart from the scope of the present invention.

Further, in the above embodiments, the two lens units structured in the zooming optical system are respectively driven by the two vibration actuators having the same structure. However, even if any one of the two lens units is driven by a different-type driving device, such the structure does not depart from the scope of the present invention.

Based on the present invention, the reaction force of the pressing force against the driven member while the vibration member is energized, is prevented from exerting a force against a lens frame and the guide shaft. Due to this, the change of the friction force produced between the lens frame and the guide shaft is reduced, and thereby the lens barrel having high driving efficiency and high durability with stable operation, can be attained.

While the preferred embodiments of the present invention have been described using specific term, such description is for illustrative purpose only, and it is to be understood that changes and variations may be made without departing from the spirit and scope of the appended claims.

What is claimed is:

1. A lens barrel, comprising:
   a plurality of lens units to focus light coming from a subject onto an imaging element;
   an actuator to move at least a lens unit included in the plurality of lens units; and
   a housing member to support the plurality of lens units and the actuator;
   wherein the actuator includes:
      a vibrating device comprising two vibrating members, each of which includes a plurality of piezoelectric elements aligned in a line, so that the two vibrating members intersect each other at a predetermined angle and vibrate in response to high-frequency electric signals;
      a driven member, coupled to the lens unit, to be moved by vibrations generated by the vibrating device; and
      a supporting section that includes a roller rotatably fitted on a shaft disposed opposite to the vibrating device such that the vibrating device press-contacts the driven member while a pair of the vibrating device and the roller tightly clips the driven member between the vibrating device and the roller, and a straight line that links a center of the shaft to a contact point at which the vibrating device contacts the driven member, is substantially perpendicular to the driven member; and wherein the driven member is disposed at a side of the lens unit, while the vibrating device and the supporting member are disposed at a side of the housing member.

2. The lens barrel of claim 1, further comprising:

a position detecting sensor to detect a current position of the lens unit, the position detecting sensor including a sensor scale and a sensing section;

wherein the sensing section is disposed at a side of the lens unit, while the sensor scale is disposed at a side of the housing member.

3. The lens barrel of claim 2, wherein the plurality of lens units constitute a zooming optical system in which plural moving lens units are moved for zooming and focusing; and wherein the sensor scale, included in the position detecting sensor, is commonly employed for detecting current positions of the plural moving lens units.

4. The lens barrel of claim 1, wherein the actuator is disposed inside the housing member.

* * * * *